United States Patent
Pelly

[11] Patent Number: 6,104,149
[45] Date of Patent: *Aug. 15, 2000

[54] CIRCUIT AND METHOD FOR IMPROVING SHORT-CIRCUIT CAPABILITY OF IGBTS

[75] Inventor: Brian R. Pelly, Palos Verdes Estates, Calif.

[73] Assignee: International Rectifier Corp., El Segundo, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/807,781

[22] Filed: Feb. 28, 1997

[51] Int. Cl.$^7$ .................................................. H02K 23/00
[52] U.S. Cl. ..................... 318/254; 318/439; 318/138; 318/139; 318/801; 318/434; 361/93; 361/100; 361/31; 363/109; 363/131
[58] Field of Search .................................... 318/254, 437, 318/138, 801, 802, 806, 434, 139; 361/93, 100, 101, 31; 363/109, 124, 131, 133

[56] References Cited

U.S. PATENT DOCUMENTS

| | | | |
|---|---|---|---|
| Re. 35,190 | 3/1996 | Zylstra et al. | 363/146 |
| 3,577,125 | 5/1971 | Frisbie | 340/825.8 |
| 4,338,646 | 7/1982 | Davis et al. | 361/18 |
| 4,451,778 | 5/1984 | Fischer et al. | 323/282 |
| 4,555,742 | 11/1985 | Gray et al. | 361/93 |
| 4,570,198 | 2/1986 | Storti et al. | 361/20 |
| 4,628,235 | 12/1986 | Goings | 318/430 |
| 4,743,815 | 5/1988 | Gee et al. | 318/254 |
| 4,771,357 | 9/1988 | Lorincz et al. | 361/87 |
| 4,783,714 | 11/1988 | Kalina | 361/101 |
| 4,841,207 | 6/1989 | Cheyne | 388/811 |
| 4,860,154 | 8/1989 | Fazlollahi | 361/101 |
| 5,047,662 | 9/1991 | Edwards | 307/296.4 |
| 5,091,664 | 2/1992 | Furuhata | 327/574 |
| 5,117,167 | 5/1992 | Kazmirski | 318/439 |
| 5,123,746 | 6/1992 | Okado | 363/37 |
| 5,140,244 | 8/1992 | Lyons et al. | 318/761 |
| 5,210,479 | 5/1993 | Kimura et al. | 318/727 |
| 5,221,850 | 6/1993 | Sakurai | 257/173 |
| 5,355,298 | 10/1994 | Seki | 363/58 |
| 5,357,181 | 10/1994 | Mutoh et al. | 318/139 |
| 5,365,397 | 11/1994 | Kadota | 361/93 |
| 5,367,424 | 11/1994 | Even | 361/18 |
| 5,444,591 | 8/1995 | Chokhawala et al. | |
| 5,539,254 | 7/1996 | Eytcheson et al. | 257/691 |
| 5,559,347 | 9/1996 | Yamazaki et al. | 257/139 |
| 5,563,759 | 10/1996 | Nadd | 361/101 |
| 5,608,595 | 3/1997 | Gourab et al. | 361/79 |
| 5,650,709 | 7/1997 | Rotunda et al. | 318/802 |
| 5,652,825 | 7/1997 | Schmider et al. | 388/822 |
| 5,734,260 | 3/1998 | Tasdighi et al. | 323/312 |
| 5,757,234 | 5/1998 | Lane | 330/256 |
| 5,767,555 | 6/1998 | Sakano et al. | 257/401 |
| 5,831,410 | 11/1998 | Skibinski | 318/807 |
| 5,838,175 | 11/1998 | Hsieh | 327/94 |
| 6,018,270 | 1/2000 | Stuebing et al. | 330/278 |

FOREIGN PATENT DOCUMENTS

| | | |
|---|---|---|
| 4334386 | 4/1994 | Germany . |
| 4410211A1 | 10/1995 | Germany . |
| 2266712 | 10/1990 | Japan . |
| 53680 | 1/1993 | Japan . |
| 6291323 | 10/1994 | Japan . |

OTHER PUBLICATIONS

Z. John Shen and Steve P. Robb: "Design and Modeling of the 600V IGBT with Emitter Ballast Resistor" Power Conversion Electronics, Sep. 1995 Proceedings, pp. 54–61.

*Primary Examiner*—Brian Sircus
*Attorney, Agent, or Firm*—Ostrolenk, Faber, Gerb & Soffen, LLP

[57] ABSTRACT

A simple, off-chip circuit and method for endowing high efficiency IGBTs with short-circuit capability, that is essentially transparent to the user. The invention involves adding an external common emitter resistor to reduce the effective gain of an IGBT under short circuit. Under normal operating conditions, the voltage across the resistor is small, such that the modifying effect on the normal operating gate-emitter voltage is almost negligible.

17 Claims, 6 Drawing Sheets

CIRCUIT AND METHOD FOR IMPROVING SHORT-CIRCUIT CAPABILITY OF IGBTS

BACKGROUND OF THE INVENTION

1. Field of the Invention

The present invention relates to short-circuit protection circuits and, more specifically, to a circuit for protecting high efficiency IGBTs in a motor controller circuit.

2. Description of the Related Art

A common requirement of IGBT inverters for motor control is that the IGBTs must be able to withstand short-circuits for periods that are in the range of 5 to 10 μs.

The capability of an IGBT to withstand short-circuit for a given period of time is essentially determined by the gain under short-circuit.

At present, two basic types of IGBTs are generally available, namely "short-circuit" types which are designed primarily for motor control applications, and "high-efficiency" types, which are designed for applications where short-circuit capability is not needed, such as switching power supplies. An inherent trade-off exists between these two types of devices. Short-circuit IGBTs (typically designed to withstand short-circuits for up to 10 μs) are inherently less efficient than high-efficiency IGBTs, but the latter have more limited short-circuit capability.

As illustrated by the plots shown in FIG. 1, Gen 4 high-efficiency IGBTs manufactured by the assignee of the present application, International Rectifier Corporation, have about twice the short-circuit current of short-circuit rated types. The greater short-circuit current of the high-efficiency type restricts its short-circuit withstand time to less than a half of that of the short-circuit rated type.

It would be desirable for semiconductor manufacturers such as the present assignee to eliminate the manufacture of short-circuit rated components, in favor of high efficiency types only.

The potential advantages would be:

1. Simplified manufacturing logistics, inventory control, etc., through the manufacture of one basic high-efficiency type of IGBT, instead of two different types; and
2. Better system solutions for applications that require short-circuit capability, with greater design flexibility and improved system performance.

SUMMARY OF THE INVENTION

The present invention achieves the above-described objectives and advantages by providing a circuit and method for improving the short-circuit capability of high-efficiency IGBTs in a strikingly simple off-chip solution which is essentially transparent to the user.

More specifically, the present invention, in its various embodiments, comprises the addition of an external common emitter resistor to a high gain high efficiency type of IGBT to increase the short-circuit capability of the IGBT.

Other features and advantages of the present invention will become apparent from the following description of the invention which refers to the accompanying drawings.

DETAILED DESCRIPTION OF THE PREFERRED EMBODIMENTS

Figure 1:
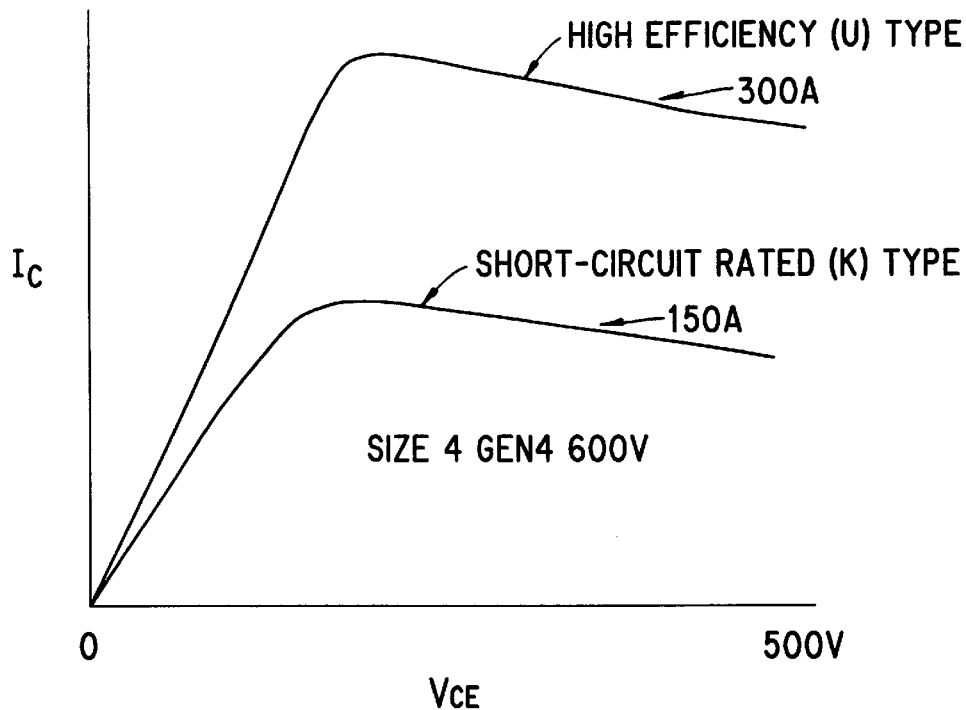
FIG. 1 shows the short circuit characteristics of high-efficiency IGBTs vs. short-circuit rated IGBTs.
Figures 2A, 2B:
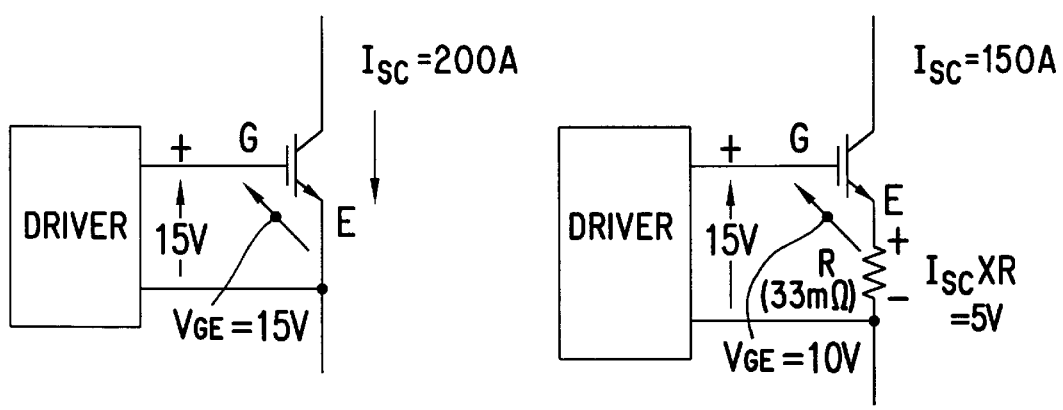
FIGS. 2A and 2B shows the effect of adding a common-emitter resistance on the short circuit current of high-efficiency IGBTs in accordance with the present invention.

A comparison of FIGS. 2A and 2B shows the addition of an external common emitter resistor R to the high gain high efficiency type of IGBT, in accordance with the present invention. More specifically, the addition of resistor R in the main emitter current carrying path as shown in FIG. 2B reduces the effective gain under short-circuit, by virtue of the voltage $I_{sc} \times R$, which subtracts directly from the net gate-emitter voltage.

Figure 3:
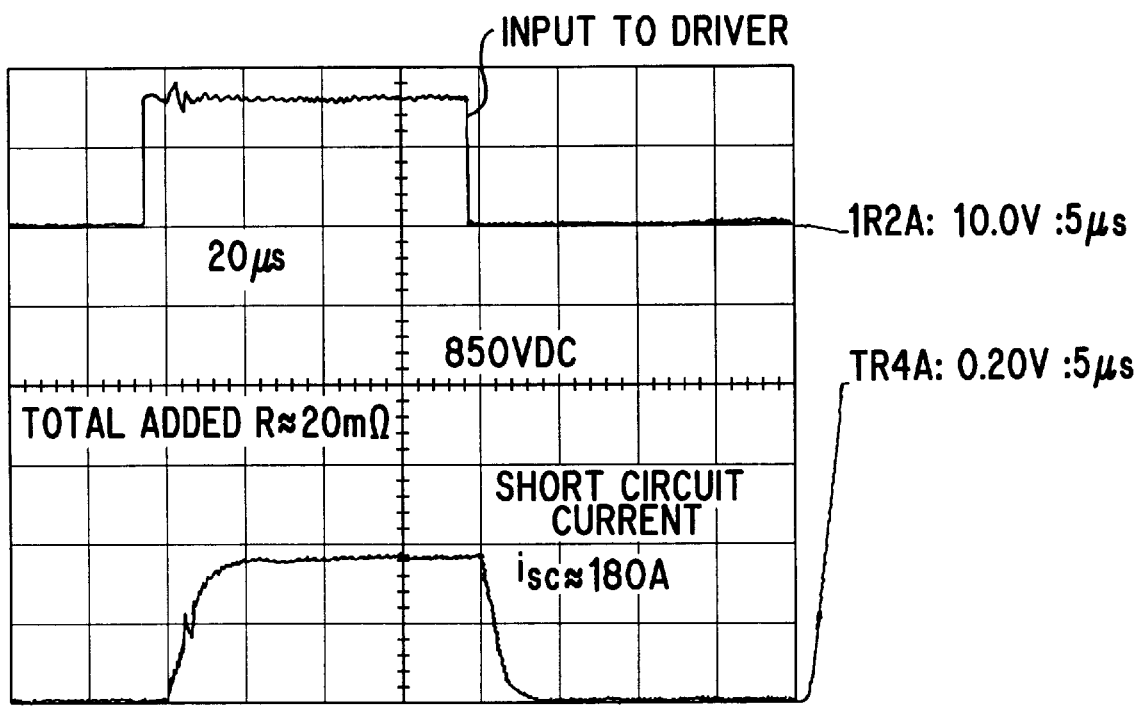
FIG. 3 demonstrates the 20 μs short-circuit withstand time of a 1200V size 7 Gen 3 IGBT provided with a 20 mohm common emitter resistance.

The oscillograms shown in FIG. 3 demonstrate an example in which a 20 mΩ common emitter resistor, for a size 7 1200V IGBT, permits a short-circuit time of 20 μs at 850V, as compared with a short circuit withstand time of about 5 μs without the resistor.

Advantageously, under normal operating conditions, the voltage developed across R is small, and the modifying effect on the normal operating gate-emitter voltage is almost negligible, as evidenced by the following calculated estimates.

1. Circuit of FIG. 2B with 600V, Size 4, Gen 4 High-Efficiency IGBT, provided with 33 mΩ common emitter resistor R:

Normal operating output current (3 hp)=12 A rms
Normal operating current in R=8.4 A rms
Normal operating loss in R=8.4²×0.033
   =2.3 W.
Estimated losses in IGBT at 12 A output:

| Frequency | Loss   | Percent Losses in R |
|-----------|--------|---------------------|
| 4 kHz     | 13.5 W | 17.6                |
| 8 kHz     | 15.4 W | 14.9                |
| 12 kHz    | 17.8 W | 12.9                |

2. Circuit of FIG. 2B with 1200V, Size 4, Gen 4 High-Efficiency IGBT, provided with 66 mΩ common emitter resistor R:

Normal operating output current=6 A rms
Normal operating current in R=4.2 A rms

Normal operating loss in R=$4.2^2 \times 0.066$
=1.15 W.
Estimated losses in IGBT at 6 A output:

| Frequency | Loss | Percent Losses in R |
|---|---|---|
| 4 kHz | 11.3 W | 10.6 |
| 8 kHz | 18.1 W | 6.6 |
| 12 kHz | 24.8 W | 4.8 |

The above calculations show that the projected losses in the common emitter resistor at full load, for a 600V rated high efficiency IGBT, are between 13 and 17.5% of the IGBT losses, for a common emitter resistor that provides 10 µs short-circuit time. This estimated added loss in the resistor actually is about the same as the estimated added loss for a 10 µs short-circuit rated 600V IGBT, over that of a high efficiency type.

The estimated full load losses in the common emitter resistor that provides 10 µs short-circuit capability for a 1200V rated high efficiency IGBT are between 5 and 11% of the IGBT losses. Significantly, these added losses are about 30% less than the loss which would be added if a 10us short-circuit rated 1200V IGBT were used instead of a high-efficiency type with a common emitter resistor.

Although the use of a common emitter resistor in accordance with the present invention probably does not afford any significant reduction of overall losses, versus the losses of short-circuit rated types, when viewed at the component level, the invention does in fact offer reduced losses at the system level, as well as other application advantages, in addition to the manufacturing advantages discussed above. The application advantages are as follows:

1. Short-circuit time can be tailored to the specific value required for a particular application without changing the IGBT design, simply by selecting the value of the common emitter resistance. The lower the required short circuit time, the lower the resistance value and the lower the added losses.

2. The added losses in the common emitter resistor are dissipated externally to the IGBT die. The IGBT remains a high efficiency type with minimum losses, allowing more output for a given IGBT die size than can be obtained from short-circuit rated IGBTs; i.e., given that power has to be dissipated, it is better to dissipate power in a resistor than in the IGBT.

3. In a three-phase inverter for motor control, a common emitter resistor for only three of the six IGBTs can endow the entire inverter with the necessary short-circuit capability (e.g. 10 µs), as discussed in further detail below. Moreover, a single common emitter resistor can serve all three IGBTs in the lower section of a three phase inverter circuit. The total loss contribution of the common emitter resistor or resistors reduces the incremental losses of the total inverter to about 7.5% versus 15% total incremental losses for six short-circuit rated IGBTS. It should be recognized, however, that it would be possible to use three short-circuit-rated IGBTs and three high efficiency types, and no common emitter resistors, to achieve a circuit with about the same overall losses. However, such a circuit would require two different types of IGBTs and would therefore not achieve the stated objective of the invention to eliminate the need for short-circuit IGBTs.

Figure 4A:
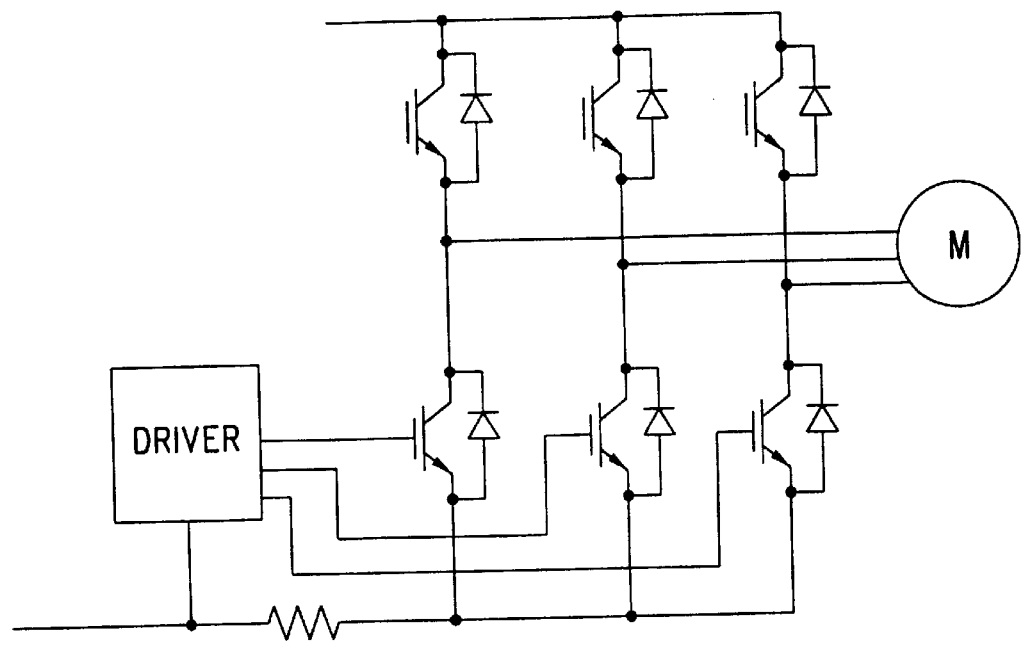
FIG. 4A shows the use of an existing current sensing shunt in the common lower bus circuit to provide common emitter resistance for limiting short-circuit current.
Figure 4B:
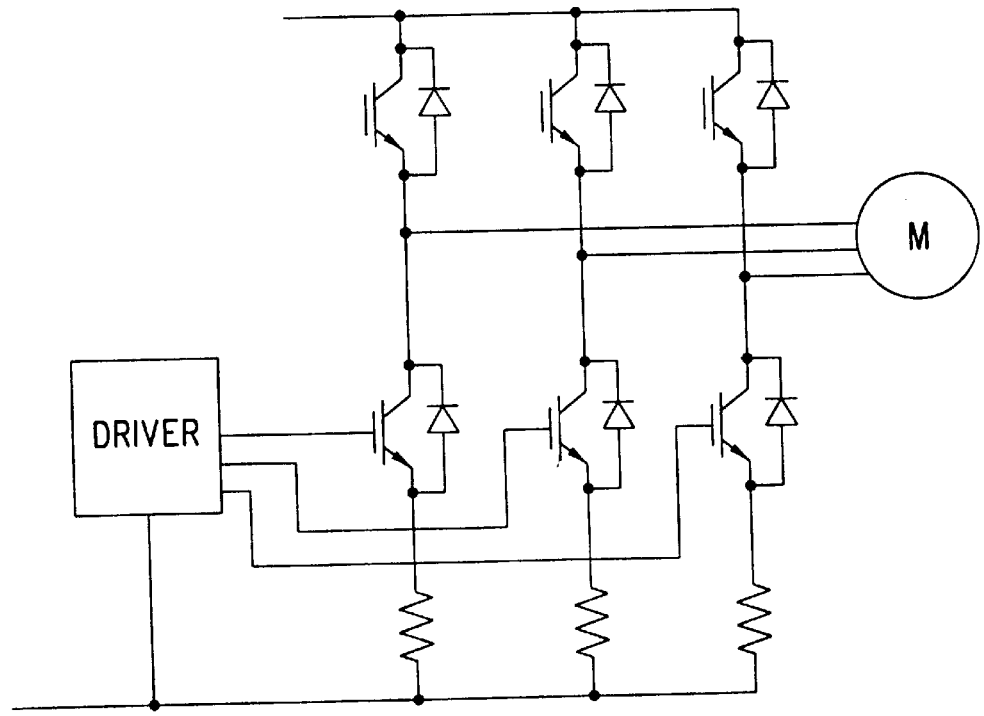
FIG. 4B shows the use of existing individual vector control lower legs shunts to provide common emitter resistance for limiting short-circuit current.

4. If a resistive current measuring shunt is a part of the total powertrain, as will normally be the case for drives up to a few horsepower, the shunt resistor (or resistors) can serve the dual functions of common emitter resistance for short-circuit current limiting, and current signal feedback. This is shown in FIGS. 4A and 4B. The present invention therefore makes it feasible to substitute high efficiency IGBTs into existing powertrains that include a single lower shunt resistor (or individual "vector control" shunt resistors for the lower IGBTs), obtain 10 µs short-circuit capability, and reduce the total inverter losses by about 15% for the same output current.

Various embodiments of the common emitter resistor circuit of the present invention are as follows:

1. The preferred method and circuit is to use existing current sensing shunt (or shunts) if such shunts are already present in the powertrain.

2. An alternative embodiment is to use bonding wires with the desired resistance.

3. A further embodiment is to mount external thick film resistors on the substrate of a powertrain circuit board.

4. A still further embodiment is to use connectors from a power level circuit board to a separate driver board having the desired resistance.

5. Another embodiment is to add the desired resistance in a separate driver board.

To obtain lower incremental losses during normal operation and/or increased short-circuit time, a non-linear common emitter resistor with a low resistance value at normal operating current and a higher value at short-circuit current is preferred in yet another possible embodiment of the present invention. Such a nonlinear resistor can be realized by:

1. A polysilicon resistor with a positive temperature coefficient. The increased temperature caused by the short-circuit current would give higher common emitter resistance when needed, increasing the short-circuit withstand time. The increased resistance at higher operating temperature would also give greater limiting of short-circuit current when the fault occurs at initial high operating temperature.

Figure 5:
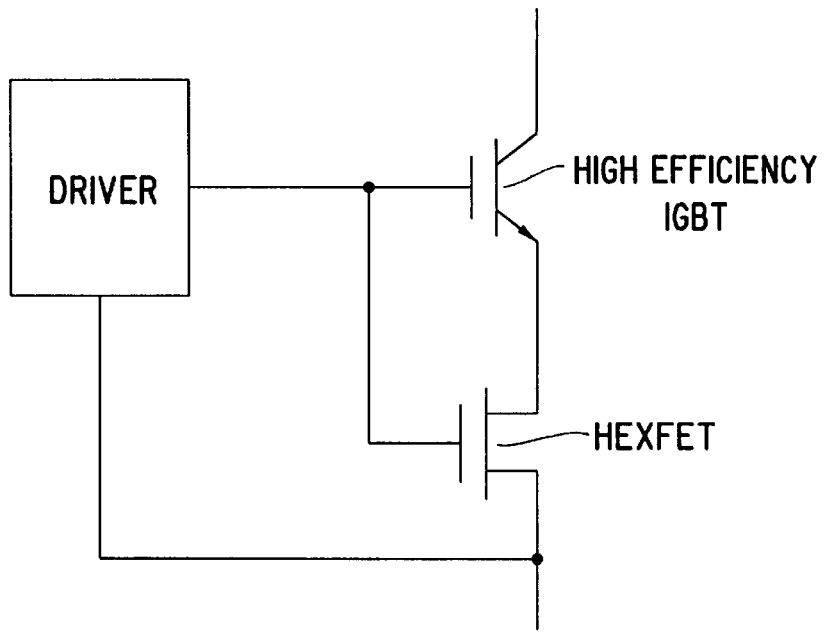
FIG. 5 shows the use of a low voltage HEXFET to protect a high voltage, high-efficiency IGBT.

2. A device having a resistance which increases with current, such as a power MOSFET, e.g. a 20V HEXFET manufactured by the present assignee, International Rectifier Corporation. FIG. 5 shows the circuit configuration in which a 20V HEXFET (e.g. a Gen 5 size 1 HEXFET) provides the common emitter resistance for a high efficiency IGBT (e.g. a Gen 4 600V Size 4 high efficiency IGBT). The short-circuit current of the IGBT is limited to that of the HEXFET. Thus, in the example of FIG. 5, the high efficiency IGBT is endowed with a short-circuit time of about 15 µs. Since the area of the HEXFET die is about 15% of that of the IGBT, the added HEXFET does not add significant cost. Note that, in the configuration shown in FIG. 5, it is possible to apply drive pulses only to the IGBT or only to the HEXFET, with only a fixed 15V applied to the gate of the other device.

As stated previously, a single common emitter resistor, or individual resistors for the bottom IGBTs only of a three-phase inverter, can be used to protect all six IGBTs against line-to-line output short-circuit. This is because line-to-line short-circuit current flows through a lower and an upper IGBT in series. Line-to-line short-circuit protection of the upper IGBT is thus provided by the current limiting action of the lower IGBT.

The use of common emitter resistors for just the upper side IGBTs also provides complete inverter protection against line to line short circuits. However, where a resistive shunt, or shunts, are already present in the bottom side of the circuit, it is simpler and more economical to utilize such existing components as the common emitter resistance.

It should be recognized that, under certain types of faults, it is possible for fault current to flow just through the upper side IGBTs, in which case the lower side IGBTs are powerless to limit the current in the upper side. Two types of fault that can give rise to short-circuit current in the top IGBTs only are as follows:

Type 1 fault—Ground fault at the output of the inverter.

Type 2 fault—Inadvertent external connection of a short-circuit from an ac output terminal to the negative bus terminal, N.

Figure 6:
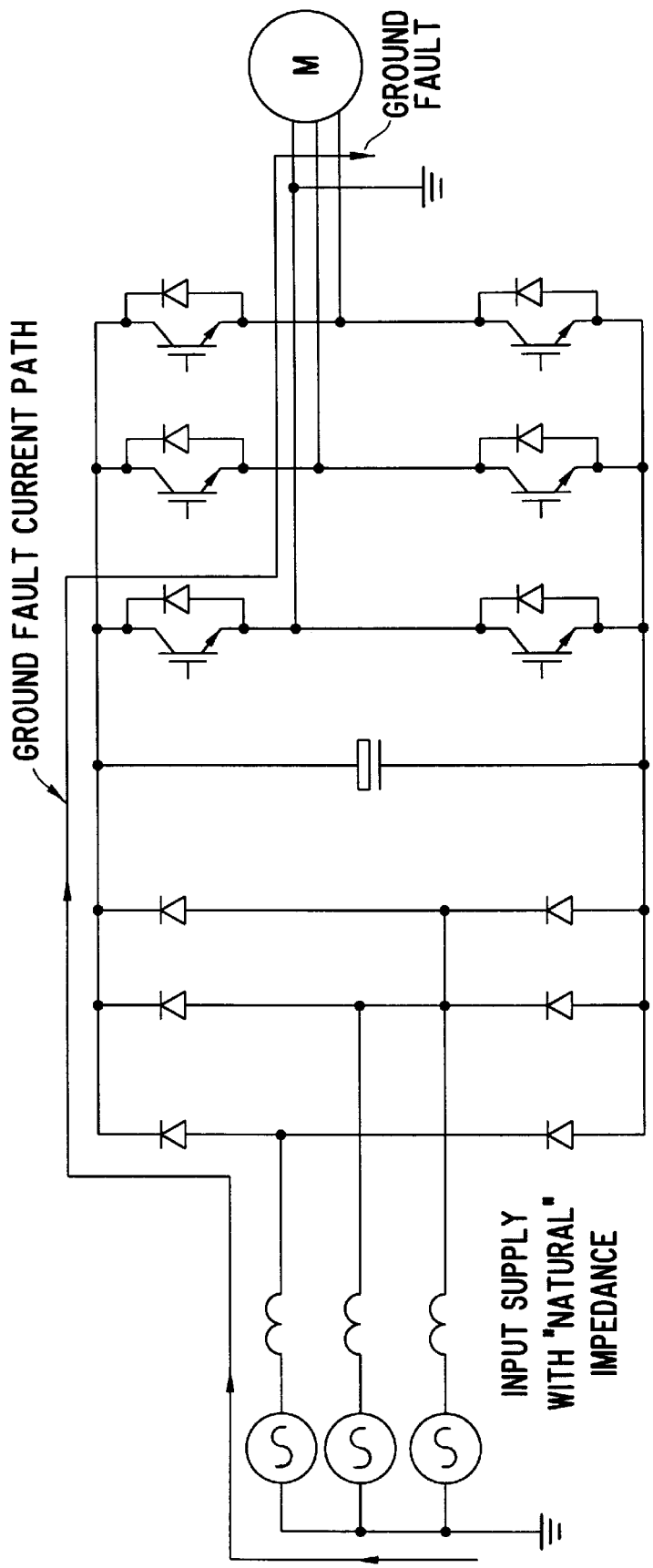
FIG. 6 shows that ground fault current flows through the input line impedance, and therefore has a slow rate of rise and limited amplitude.

Both of these types of faults can be handled without resort to common emitter resistors for the upper side IGBTs. Specifically, Type 1 faults can almost always be withstood naturally by high efficiency IGBTs for a period of 10 $\mu s$ or more without any additional means of protection. As shown in FIG. 6, since the path for ground fault current is through the input supply impedance, the rate of rise and prospective amplitude of ground fault current is severely limited by the impedance of the ac input line. The relatively low amplitude ground fault current will not damage high efficiency IGBTs within a 10 $\mu s$ shut-down period.

Type 2 faults are more severe, because fault current flows from the low impedance bus capacitor via the upper side IGBT to the negative bus terminal N. The need for common emitter resistors for the upper side IGBTs for this type of fault can be avoided by:

a) Preventing user access to the negative bus terminal N. The reason for providing external access to the negative bus N is to provide a connection point for an optional external brake circuit. Powertrains that have an internal brake transistor therefore do not require an externally accessible N terminal. The possibility still exists that a user might miswire an inverter ac terminal to the brake terminal, but now the brake IGBT, with its own common emitter resistor, will provide short circuit protection for the upper side IGBT.

b) Designing the upper bus current detector to discriminate between line-to-line faults and Type 2 faults, the latter having a much higher short-circuit current because of the higher effective gain of the upper side IGBTs, which do not have common emitter resistors. For example, the upper bus may be provided with a resistor/opto circuit which is designed to discriminate between the line-to-line and the Type 2, higher current, faults. The resistor/opto detection circuit is designed to respond more slowly than the lower fault detection circuit to line-to-line fault, allowing the latter to control the shut-down time for line-to-line fault.

The upper detection circuit is preferably designed to respond as rapidly as possible to the higher amplitude Type 2 faults, so that it shuts down the inverter and protects the upper IGBTs as quickly as possible, e.g. within 1 or 2 $\mu s$.

Figure 7:
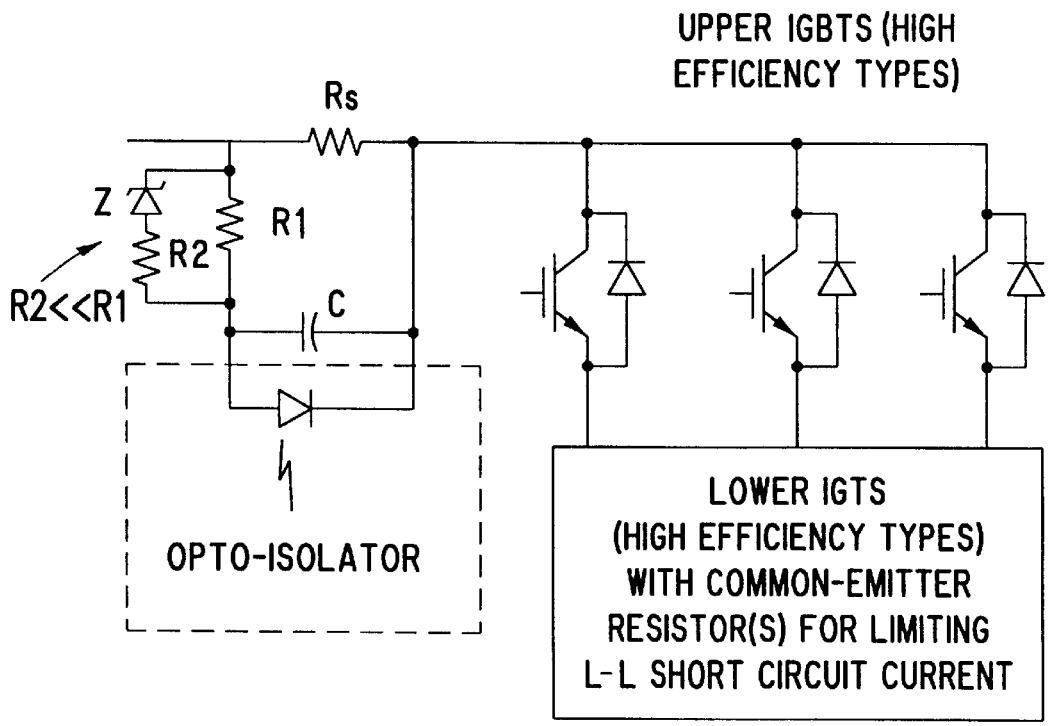
FIG. 7 shows an upper fault detector design for slow response to a line-to-line short circuit, and rapid response to a short circuit resulting from an inadvertent external connection of an ac output terminal to the negative bus terminal.

A conceptual schematic of the upper fault detector is shown in FIG. 7. For line-to-line short-circuit, the voltage developed across $R_s$ is insufficient for Zener diode Z (or some other type of threshold diode) to conduct. Capacitor C charges through resistor R1. The time constant R1C is such that the opto does not deliver an output during the trip time set by the lower detection circuit (not shown). It should be noted that Zener diodes may not be available with a sufficiently low threshold, in which case Zener diode Z can be replaced by two or three diodes in series, or possibly an LED, which has about a 2V threshold.

For a high amplitude Type 2 fault, the voltage developed across $R_s$ is sufficient for Z to conduct. Capacitor C now charges rapidly via R2, which has a much lower resistance value than R1. The opto-isolator delivers a trip pulse within 1 or 2 $\mu s$, protecting the upper IGBTs. A trip time of 1 or 2 $\mu s$ for Type 2 faults only should be completely noise-free, thus avoiding "nuisance trip" problems with very fast shut-down time for this type of fault.

Figure 8:
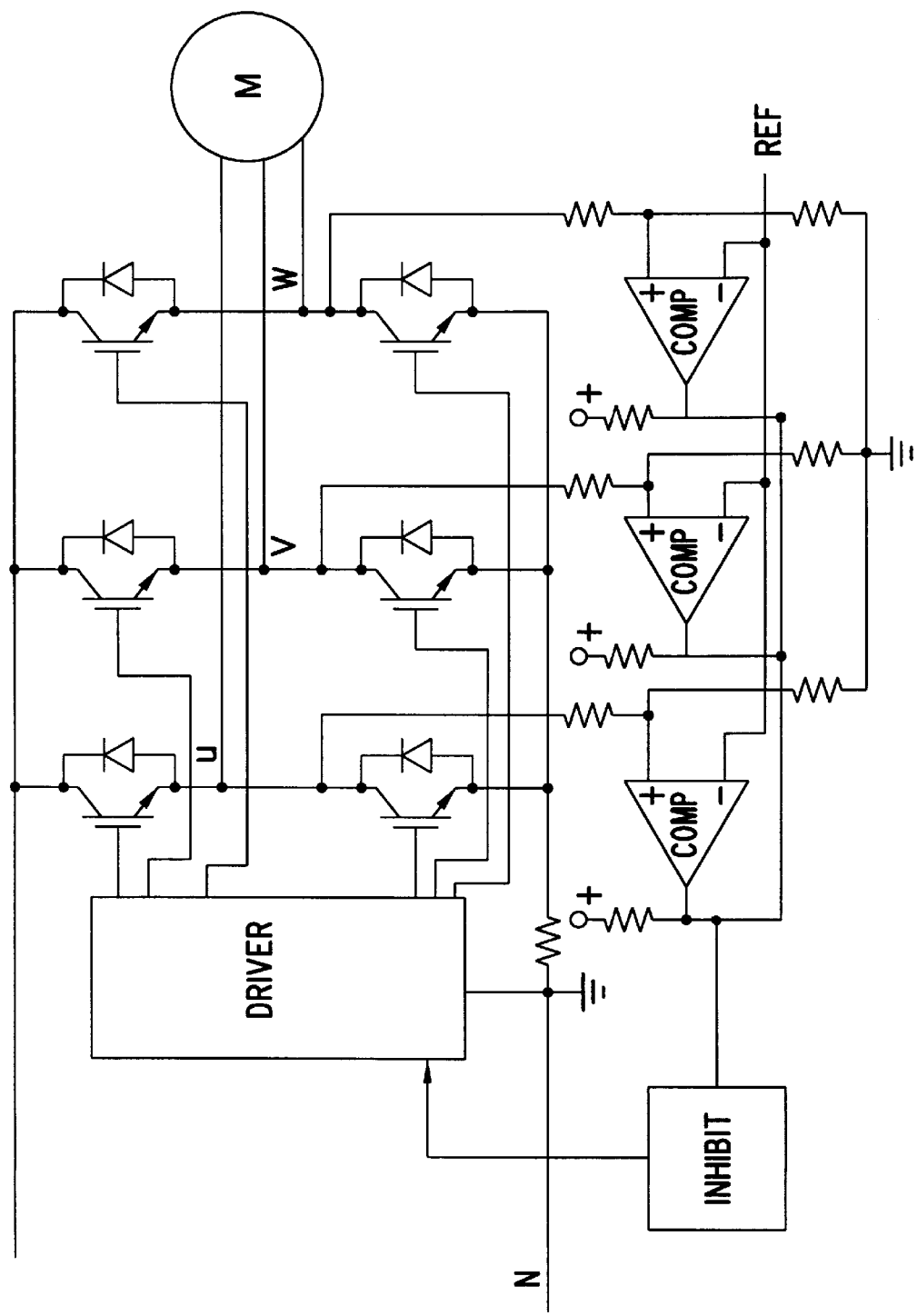
FIG. 8 shows a circuit for avoiding a short circuit resulting from an inadvertent external connection of an ac output terminal to the negative bus terminal by detecting a pre-existing short circuit and inhibiting the gate driver.

For normal levels of fault current, the top trip circuit actually has more filtering and more noise immunity than the bottom one. A fast trip can only be initiated by abnormally high current in the upper shunt, which itself can only be caused by a bona fide Type 2 fault.

c) Adding a circuit that detects a low impedance between any ac output terminal to the negative bus terminal N, to prevent the occurrence of Type 2 faults as a result of miswiring between terminals prior to powering-up the inverter. If a low impedance is detected from either U, V or W to N during the power-up period, while the IGBT gates are still inhibited, inhibition of the driver (and hence the driver signal to the IGBT gates) at the end of power-up sequence is maintained, thereby preventing initiation of a type 2 fault. A conceptual implementation is shown in FIG. 8.

The present invention, in the various embodiments set forth above, offers a way of focusing manufacturing of high efficiency IGBTs only, with all the ramifications relative to cost savings thereby entailed.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A circuit for protecting a high efficiency IGBT in a motor controller circuit, said motor controller circuit including a three-phase inverter for motor control with six high efficiency IGBTs, three of said IGBTs on a high side and three of said IGBTs on a low side, said circuit comprising a common emitter resistor provided in series with each emitter of three of said high efficiency IGBTs for (i) increasing the short-circuit capability of the IGBTs by reducing the effective gain of the IGBTs under short circuit conditions; and (ii) not being used to produce a sensed voltage for a current control circuit.

2. The circuit as recited in claim 2, wherein said individual ones of said common emitter resistors comprise at least one vector control shunt resistor for the three of said six IGBTs on the low side of said three-phase inverter motor controller circuit.

3. The circuit as recited in claim 1, wherein said common emitter resistor comprises a single shunt resistor provided on a low side rail of said three-phase inverter motor controller circuit.

4. The circuit as recited in claim 3, wherein said common emitter resistor serves the dual functions of providing a common emitter resistance for short-circuit current limiting and, in addition providing a resistive current measuring shunt for current signal feedback.

5. The circuit as recited in claim 1, wherein said common emitter resistor comprises bonding wires with the desired resistance.

6. The circuit as recited in claim 1, wherein said common emitter resistor comprises a thick film resistor on the substrate of a powertrain circuit board.

7. The circuit as recited in claim 1, wherein said common emitter resistor comprises a connector from a power level circuit board to a separate driver board having a desired resistance.

8. The circuit as recited in claim 1, wherein said common emitter resistor is disposed on a separate driver board.

9. The circuit as recited in claim 1, wherein said common emitter resistor comprises a non-linear resistance device having a low resistance value at normal operating current and a higher value at short-circuit current.

10. The circuit as recited in claim 9, wherein said non-linear resistance device comprises a polysilicon resistor with a positive temperature coefficient.

11. The circuit as recited in claim 9, wherein said non-linear resistance device comprises a power MOSFET transistor.

12. A circuit for protecting a high efficiency IGBT in a motor controller circuit, said motor controller circuit including a three-phase inverter having high efficiency IGBTs on both a high side and a low side, said circuit comprising a current detector for detecting a Type 2 fault on said high side, said current detector for detecting a Type 2 fault comprising a resistor/opto-isolator circuit including a threshold diode which permits a capacitor to be relatively rapidly charged through a resistor of a relatively low value in the presence of a Type 2 fault, and relatively slowly charged through a resistor with a relatively high value in the absence of a Type 2 fault.

13. The circuit as recited in claim 2, further comprising a current detector comprising a plurality of comparators for detecting a low impedance between any ac output terminal of said three-phase inverter circuit and a low side bus rail.

14. The circuit as recited in claim 3, further comprising a current detector comprising a plurality of comparators for detecting a low impedance between any ac output terminal of said three-phase inverter circuit and a low side bus rail.

15. A protection circuit for a three-phase inverter motor controller circuit provided with high-efficiency IGBTs on a high side, said protection circuit comprising a current detector for detecting a Type 2 fault on said high side relatively quickly as compared to other less severe faults on said high side, said current detector comprising a resistor/opto-isolator circuit including a threshold diode which permits a capacitor to be relatively rapidly charged through a resistor or relatively low value upon the occurrence of said type 2 fault.

16. The protection circuit as recited in claim 1, wherein said common emitter resistors are provided in series with said low side high efficiency IGBTs.

17. A method for protecting a high efficiency IGBT in a motor controller circuit, said motor controller circuit including a three-phase inverter for motor control with six high efficiency IGBTs, three of said IGBTs on a high side and three of said IGBTs on a low side, said method comprising the step of providing a common emitter resistance in series with each emitter of three of the high efficiency IGBTs for (i) increasing the short-circuit capability of the IGBTs by reducing the effective gain of the IGBT under short-circuit conditions; and (ii) not being used to produce a sensed voltage for a current control circuit.

* * * * *